United States Patent [19]
Iwamoto et al.

[11] Patent Number: 5,880,630
[45] Date of Patent: Mar. 9, 1999

[54] GAIN STAGE AND OFFSET VOLTAGE ELIMINATION METHOD

[75] Inventors: Shoichi Iwamoto; Takeshi Suyama, both of Kanagawa-ken, Japan

[73] Assignee: Kabushiki Kaisha Toshiba, Kawasaki, Japan

[21] Appl. No.: 729,294

[22] Filed: Oct. 10, 1996

[30] Foreign Application Priority Data

Oct. 19, 1995 [JP] Japan .................................. 7-271182

[51] Int. Cl.$^6$ ...................................................... H03F 1/14
[52] U.S. Cl. ................................................ 330/9; 330/51
[58] Field of Search ................................ 330/9, 51, 107, 330/109

[56] References Cited

U.S. PATENT DOCUMENTS

| | | |
|---|---|---|
| 4,393,351 | 7/1983 | Gregorian et al. ...................... 330/9 X |
| 4,404,525 | 9/1983 | Amir et al. ................................... 330/9 |
| 4,565,971 | 1/1986 | Brookshire ............................. 330/51 X |
| 5,479,130 | 12/1995 | McCartney ............................... 330/9 X |

*Primary Examiner*—Steven Mottola
*Attorney, Agent, or Firm*—Oblon, Spivak, McClelland, Maier & Neustadt, P.C.

[57] ABSTRACT

A gain stage and offset voltage elimination method. The gain stage includes an amplifier, condensers and a number of switches. The switches are arranged to discharge the condensers and then charge the condensors to the offset voltage during an initialize period. When an input voltage is applied to the gain stage, the condensers do not act as capacitive loads for the amplifier. The gain stage can thus more quickly charge the condensers since the charging speed is approximately equal to the slew rate of the amplifier. The period for initializing the gain stage can be shortened while minimizing the current consumed.

17 Claims, 8 Drawing Sheets

GAIN STAGE AND OFFSET VOLTAGE ELIMINATION METHOD

BACKGROUND OF THE INVENTION

1. Field of the Invention

The present invention relates to a gain stage having a switch action condensor and an offset voltage elimination method.

2. Description of the Related Art

Generally it is very effective to use a condensor and not to use a simple resistor as the component to obtain controllability of the gain of a gain stage having an OP-amp. FIG. 1 is a circuit diagram showing an example of the gain stage mentioned in U.S. Pat. No. 4,404,525. In FIG. 1, an input terminal 1 is coupled to one node X of a condenser 15 through an MOS switch 13, and a reference input terminal 29 is also coupled to the node X through an MOS switch 25. The other node Y of the condenser 15 is coupled to an inverting input node 7 of an OP-amp 5, and a reference input terminal 30 is coupled to a non-inverting input node 9 of the OP-amp 5. An output node 11 of the OP-amp 5 is coupled to an output terminal 3. Also, the output node 11 and the input node 7 of the OP-amp 5 are coupled through an MOS switch 17 and through the serial connection of an MOS switch 21 and a condensor 19. A reference input terminal 31 is coupled to node Z through an MOS switch 27. Each of the MOS switches has a control gate, and control signal $\phi 10$ is input the control gate of the MOS switches 17,25,27, and control signal $\phi 20$ is input the control gate of the MOS switches 13,21.

The control signals $\phi 10$, $\phi 20$ turn the MOS switches OFF at the time of "L" level, and ON at the time of "H" level. FIG. 2 is a timing diagram where the control signals $\phi 10$, $\phi 20$ are shown, and FIG. 2 is divided into an initialize period and an output period.

In the initialize period (from t0 to t3), the control signal $\phi 20$ is "L" level, thus the MOS switches 13,21 are OFF. At time t0, the control signal $\phi 10$ is at the "H" level, so the MOS switches 17,25,27 are turned ON. The node X is charged to the reference input voltage level(Vref) through the MOS switch 25, the node Z is charged to Vref through the MOS switch 27, and the node Y is charged to Vref plus the characteristic offset voltage level(Voff) of the OP-amp 5 (Vref+Voff) through the MOS switch 17, so that the OP-amp 5 outputs Vref+Voff since it acts as a voltage follower circuit due to the connection of the output node 11 with the inverted input node 7 through the MOS switch 17. At time t2, $\phi 10$ drops to the "L" level and the MOS switches 17,25,27 turn OFF.

In the output period (from t3 to t5), the control signal $\phi 10$ is at the "L" level and the MOS switches 17,25,27 are still in the OFF-state. At time t4 the control signal $\phi 20$ rises to the "H" level, so the MOS switches 13,21 turn ON. So, the input voltage level(Vin) is applied to the node X through the MOS switch 13, and the output voltage level(Vout) is applied to the node Z through the MOS switch 21. During this period, the node Y is in High-Impedance-state.

The charge on the condensers 15,19 is determined by the below equations, where q1 is the charge of the condensor 15 in the initialize period, Q1 is the charge of the condensor 15 in the output period, and q2 and Q2 describe the charge on the condensor 19 at same conditions mentioned for the condensor 15. C1 and C2 are the respective capacitances of the condensors 15, 19.

In the initialize period:

$$q1=C1*((Vref+Voff)-Vref) \quad \text{Equation (1)}$$

$$q2=C2*((Vref+Voff)-Vref) \quad \text{Equation (2)}$$

In the output period:

$$Q1=C1*((Vref+Voff)-Vin) \quad \text{Equation (3)}$$

$$Q2=C2*((Vref+Voff)-Vout) \quad \text{Equation (4)}$$

According to the law of charge conservation, the following equation holds.

$$(1)+(2)=(3)+(4) \quad \text{Equation (5)}$$

Thus, $$Vout=Vref+(C1/C2)*(Vref-Vin) \quad \text{Equation (6)}$$

So, as Voff is missing from equation (6), the offset voltage is eliminated in this circuit.

In one particular case of above, in which Vref is GND level (0V), equation (6) is simplified as below.

$$Vout=-(C1/C2)*Vin \quad \text{Equation (7)}$$

And in more particular case, C1=C2, equation (7) is simplified as below.

$$Vout=-Vin \quad \text{Equation (8)}$$

As equation (8) the gain stage is also used as simple inverting amp which eliminates the offset voltage.

However, in the gain stage mentioned above there is the following problem. FIG. 3 is an example of a timing diagram showing the problem. In the initialize period, the nodes X,Z are charged to Vref, and the node Y is charged to Vref+Voff by the output 11 of the OP-amp 5. When the control signal $\phi 10$ rises to "H" level, then the nodes X,Z are charged to Vref, and the node Y is charged to the latest output level of the gain stage, and after that the node Y is charged to Vref+Voff by OP-amp 5. During charging of the node Y, both of the condensors 15,19 act as a capacitive load for the OP-amp 5. So the charging speed is slower than the speed determined by slew rate of the OP-amp 5. On this account, a method of shortening the initialize period may consist of improving the slew rate of OP-amp 5. Using the slew rate to determine the electrical voltage change velocity of above the node Y is good if the operating current of the OP-amp 5 can be increased to shorten the charging time. In the present situation where low power consumption is required, however, this method is not practical.

The characteristic offset voltage Voff needs to be applied to the node Y, between the condensers 15,19 shown in FIG. 1, to remove the characteristic offset voltage of the OP-amp 5 as explained with the above technique. Accordingly, in the initialize period, the nodes X and Z need to be set to Vref. But, a certain amount of time is necessary because in actuality the Vref supply has input impedance and there is the electric wiring resistance in an MOS integrated circuit, before the nodes X and Z becomes stable at Vref.

SUMMARY OF THE INVENTION

A object of the present invention is to provide a short initialization time for a gain stage.

The present invention provides a condensor short circuit in the initialize period so that the condensors do not act as a capacitance load for the OP-amp and the reference input voltage supply.

BRIEF DESCRIPTION OF THE DRAWINGS

The accompanying drawings, which are incorporated in and constitute a part of the specification, illustrate presently preferred embodiments of the invention, and together with the general description of the preferred embodiments given below, serve to explain the principles of the invention.

DESCRIPTION OF THE PREFERRED EMBODIMENTS

Embodiments of the present invention will be described below with reference to the accompanying drawings.

Figure 4:
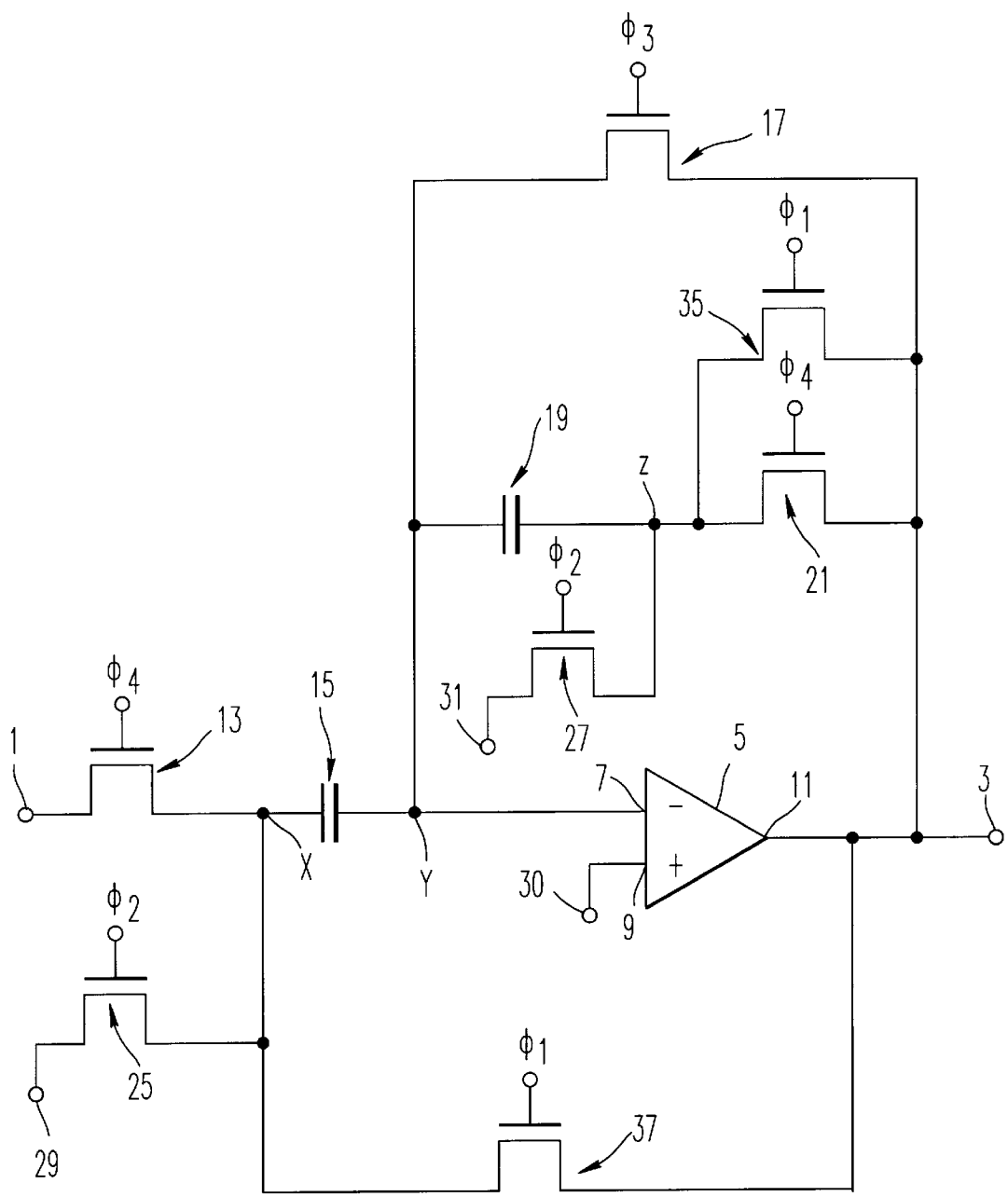
FIG. 4 is a circuit diagram of a gain stage according to the invention.

Referring now to FIG. 4 which shows a gain stage according to a first embodiment of this invention. In FIG. 4, an input terminal 1 is coupled to one node X of a condensor 15 through an MOS switch 13; and a reference input terminal 29 is also coupled to the node X through an MOS switch 25. The other node Y of the condensor 15 is coupled to an inverting input node 7 of an OP-amp 5, and a reference input terminal 30 is coupled to a non-inverting input node 9 of the OP-amp 5. An output node 11 of the OP-amp 5 is coupled to an output terminal 3. Also, the output node 11 of the OP-amp 5 is coupled to the inverting input node 7 of the OP-amp 5 through an MOS switch 17 and through the serial connection of an MOS switch 21 and a condensor 19. The output node 11 is coupled to the node Z through an MOS switch 35. A reference input terminal 31 is coupled to the node Z through an MOS switch 27. The output node 11 is also coupled to the node X through an MOS switch 37. Each of the MOS switches have a control gate, and control signal $\phi 1$ is input the control gates of the MOS switches 35,37, control signal $\phi 2$ is input the control gates of the MOS switches 25,27, control signal $\phi 3$ is input the control gate of the MOS switch 17, and control signal $\phi 4$ is input the control gates of the MOS switches 13,21.

Figure 1:
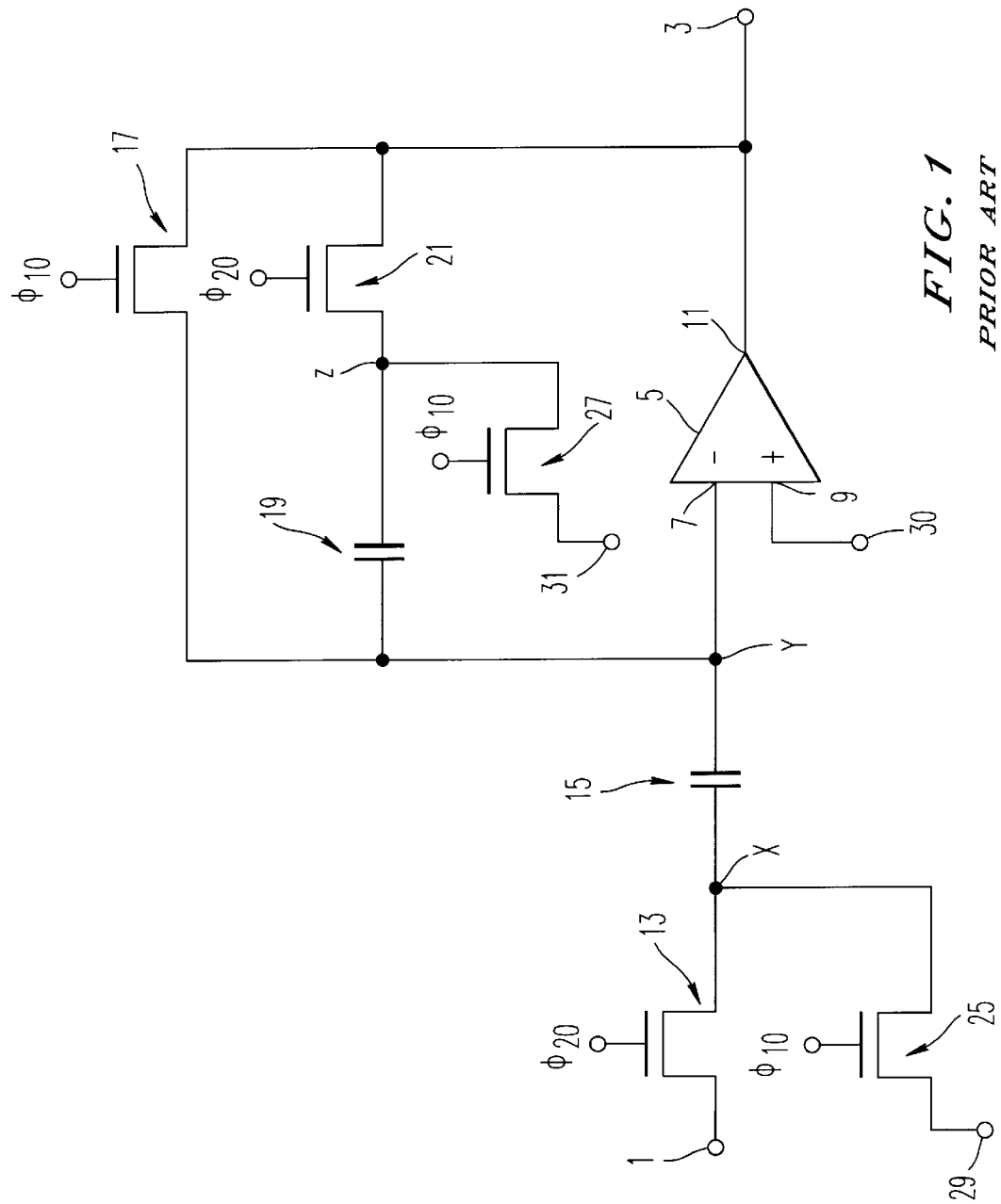
FIG. 1 is a circuit diagram of a gain stage in the prior art.
Figure 2:
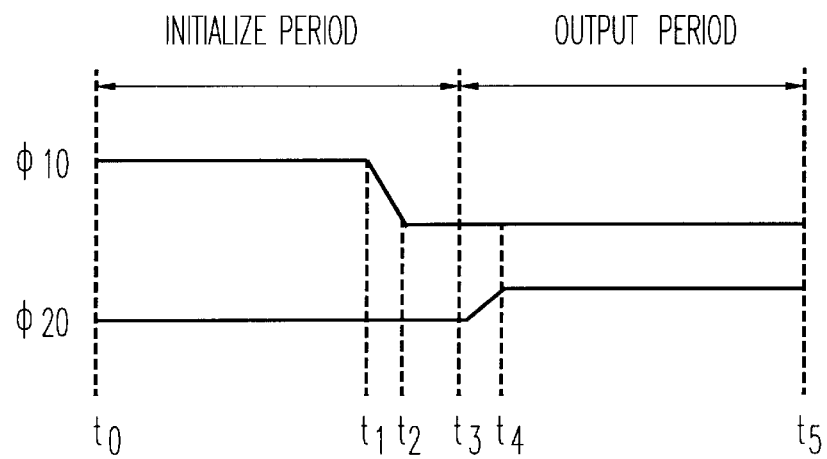
FIG. 2 is a timing diagram relating to the gain stage shown in FIG. 1.
Figure 5:
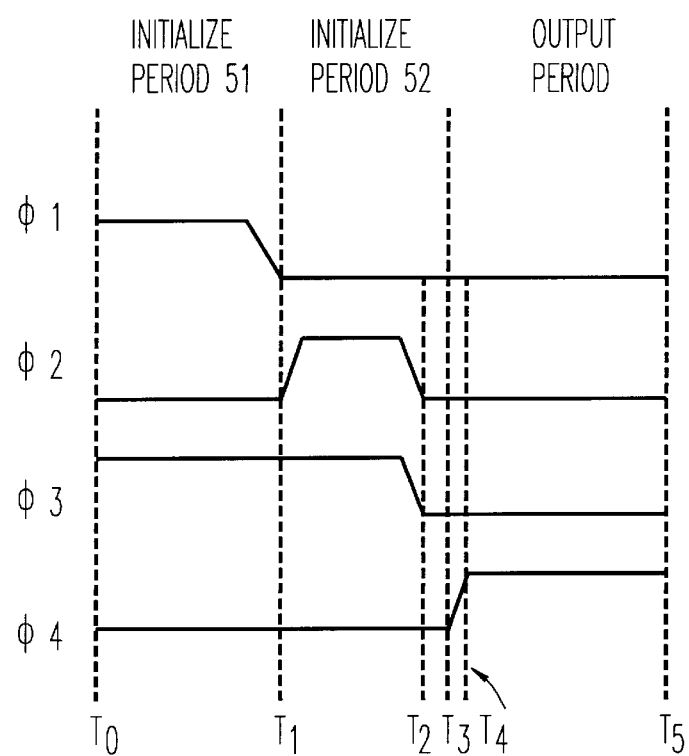
FIG. 5 is a timing diagram relating to the gain stage shown in FIG. 4.
Figure 3:
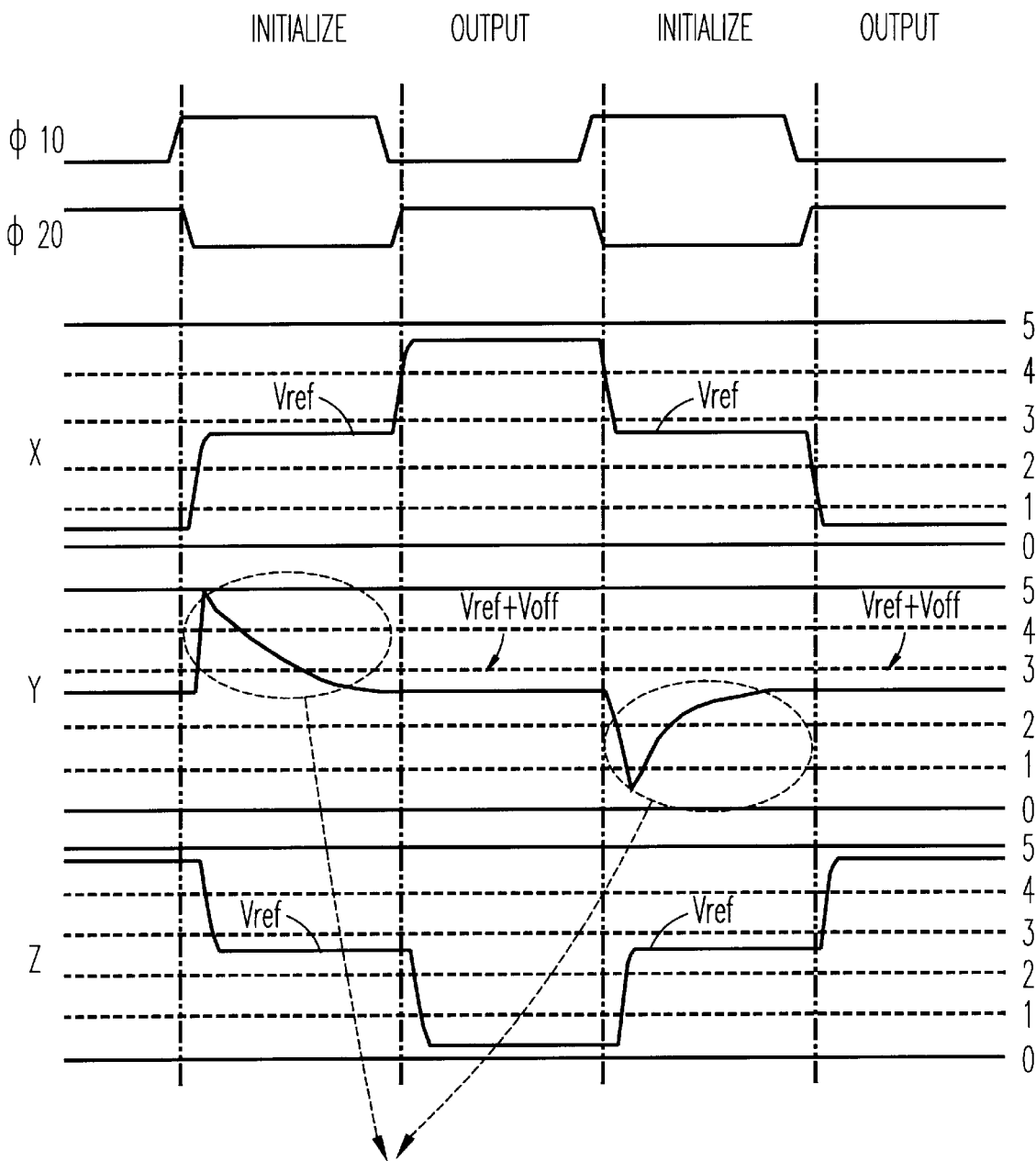
FIG. 3 is a timing diagram relating to the gain stage shown in FIG. 1.

The control signals $\phi 1$, $\phi 2$, $\phi 3$, $\phi 4$ turn the MOS switches OFF during the period of "L" level, and ON during the period of "H" level. FIG. 5 is a timing diagram showing the control signals $\phi 1$, $\phi 2$, $\phi 3$, $\phi 4$, and is divided into first and second initialize periods, and an output period.

In the initialize period 51 (from T0 to T1), the control signals $\phi 2$, $\phi 4$ are at the "L" level, thus the MOS switches 13,21,25,27 are OFF. At time T0, the control signals $\phi 1$, $\phi 3$ are at the "H" level, so the MOS switches 17,35,37 are ON. Through MOS switches 17 and 35, the nodes Y and Z (ends of condensor 19) are short-circuited, and as MOS switches 17 and 35 are ON, nodes X and Y (ends of condenser 15) become short-circuits. Accordingly the charge stored in both condensors 15,19 is discharged and the nodes X,Y,Z are at the same voltage level. Since the OP-amp 5 is a voltage follower circuit at this point, the nodes X,Y,Z are at Vref+Voff. At time T1, $\phi 1$ drops to the "L" level and the MOS switches 35,37 turn OFF and the nodes X,Y,Z are cutoff from each other.

In the initialize period 52 (from T1 to T3), the control signals $\phi 1$, $\phi 4$ are at the "L" level, thus the MOS switches 13,21,35,37 are OFF. At time T1, the control signal $\phi 3$ is still at the "H" level, so the MOS switch 17 is ON. Also at time T1, the control signal $\phi 2$ rises to the "H" level, so the MOS switches 25,27 turn ON. Nodes X,Z are charged to Vref through the MOS switches 25,27, and node Y remains at Vref+Voff since the MOS switch 17 is still ON. At time T2, $\phi 2$, $\phi 3$ have dropped to the "L" level and the MOS switches 17,25,27 turn OFF.

In the output period (from T3 to T5), the control signals $\phi 1$, $\phi 2$, $\phi 3$ are at the "L" level and the MOS switches 17,25,27,35,37 are still OFF. At time T4 the control signal $\phi 4$ has risen to the "H" level, so the MOS switches 13,21 turn ON. Vin is applied to node X through the MOS switch 13, and Vout is applied to node Z through the MOS switch 21. During this period, the node Y is in a High-Impedance-state. The gain stage outputs the voltage level which inverts the input voltage level about Vref and removes the characteristic offset voltage of the OP-amp.

Figure 6:
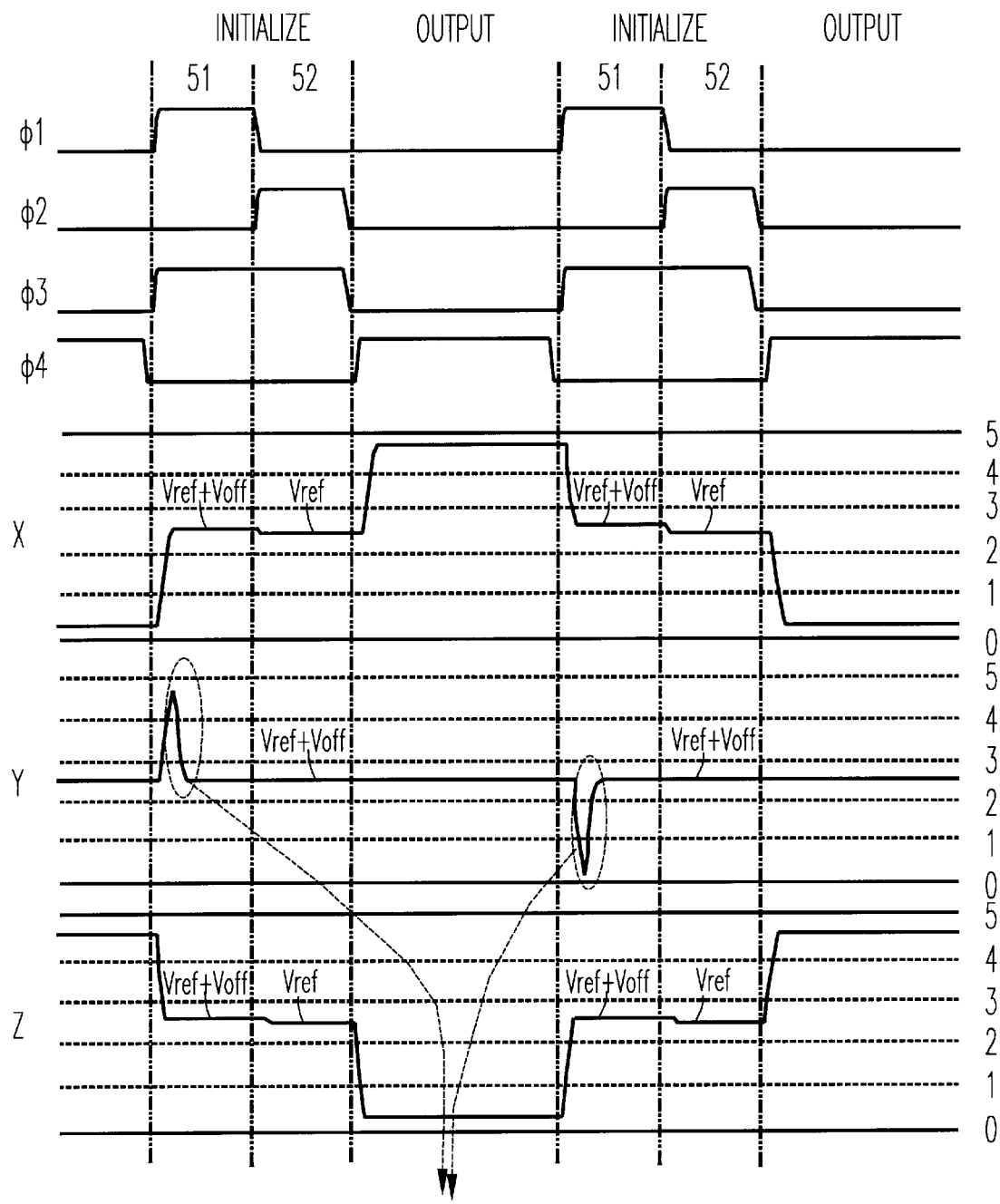
FIG. 6 is a timing diagram relating to the gain stage shown in FIG. 4.

In this embodiment the level transition of the nodes X,Y,Z in the periods above is shown in FIG. 6. FIG. 6 is an example of a timing diagram relating to the gain stage in FIG. 4. In the initialize period 51, the nodes X,Y,Z are charged to Vref+Voff by the output 11 of the OP-amp 5. When the control signal $\phi 1$ rises to "H" level, then the nodes X,Y,Z are short-circuited through the MOS switches 17,35,37. Thus, first the nodes X,Y,Z are charged toward the latest output level of the gain stage, and next the nodes X,Y,Z are charged to Vref+Voff by the output 11 of the OP-amp 5 which acts as one component of the voltage follower circuit. During this period both of the condensors 15,19 do not act as a capacitive load for the OP-amp 5, because the electrodes of the condensors 15,19 are short-circuited. So the charging speed is almost equal to the speed determined by slew rate of the OP-amp 5. In the initialize period 52, the node Y is still at Vref+Voff, and the nodes X,Z are charged to Vref. This charging is easy so that the transition level is only from Vref+Voff to Vref, the difference level Voff being always very small. In this way, according to this embodiment, the initialize period is shortened, and the electric current consumed can be restrained.

Also the three periods mentioned above are shown as separated from each other, but the end of the initialize period 51 and the beginning of the initialize period 52 may be allowed to overlap. Of course there is the current flowing between the output 11 of the OP-amp 5 and Vref, but it is small enough to ignore, because the different voltage level between the output 11 of the OP-amp 5 and Vref is only Voff.

Figure 7:
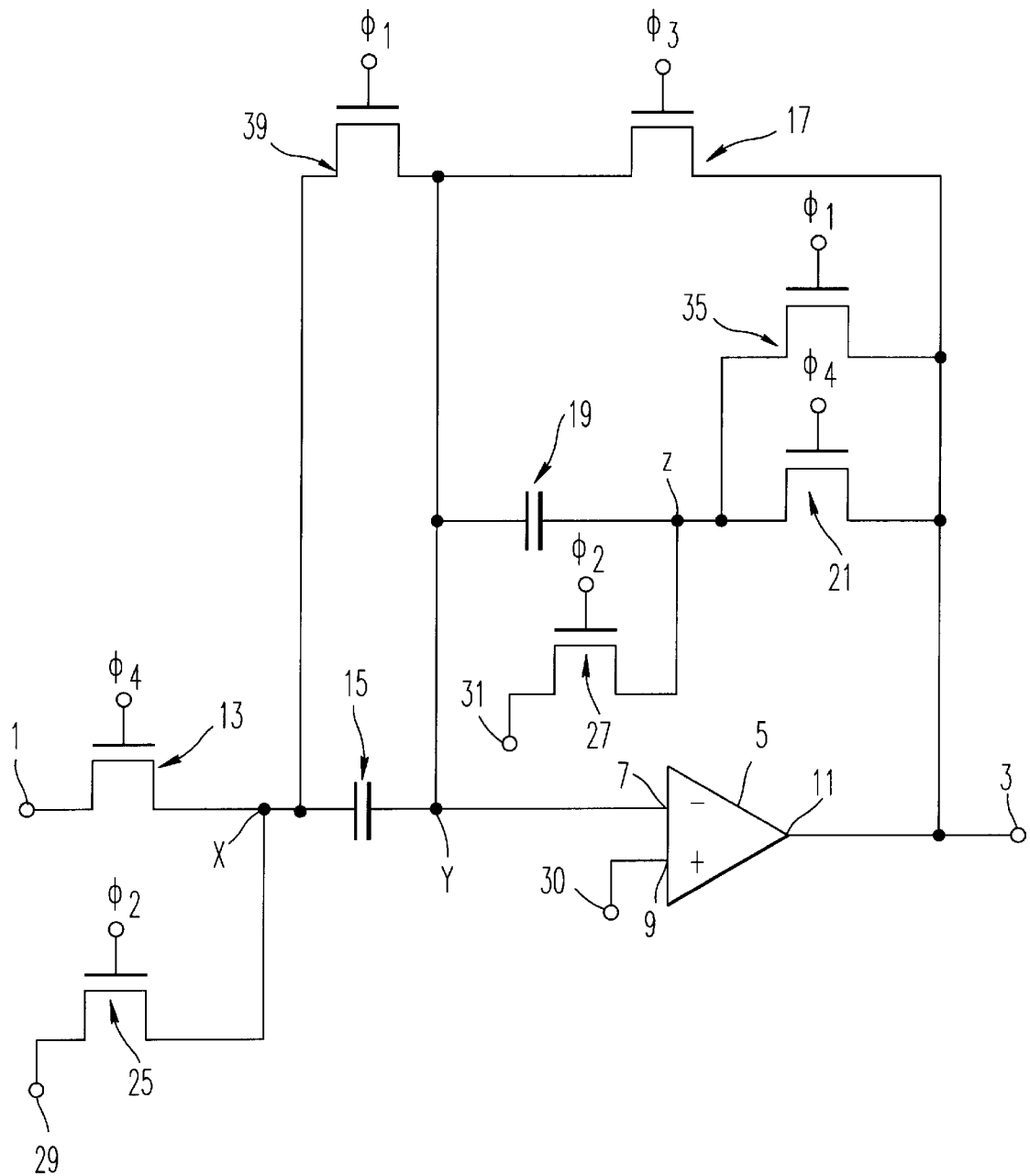
FIG. 7 is a circuit diagram of a gain stage according to the invention.

FIG. 7 is the circuit diagram illustrating the configuration of a gain stage according to the second embodiment of this invention. This gain stage has the same configuration as shown in FIG. 5 except that the MOS switch 37 is replaced by MOS switch 39 controlled by $\phi 1$. The same effect as in the first embodiment can be obtained. Namely, MOS switch 39 is ON during a period from T0 to T1, shorting node X to the output 11 of the OP-amp 5 since the MOS switch 17 is also ON.

Figure 8:
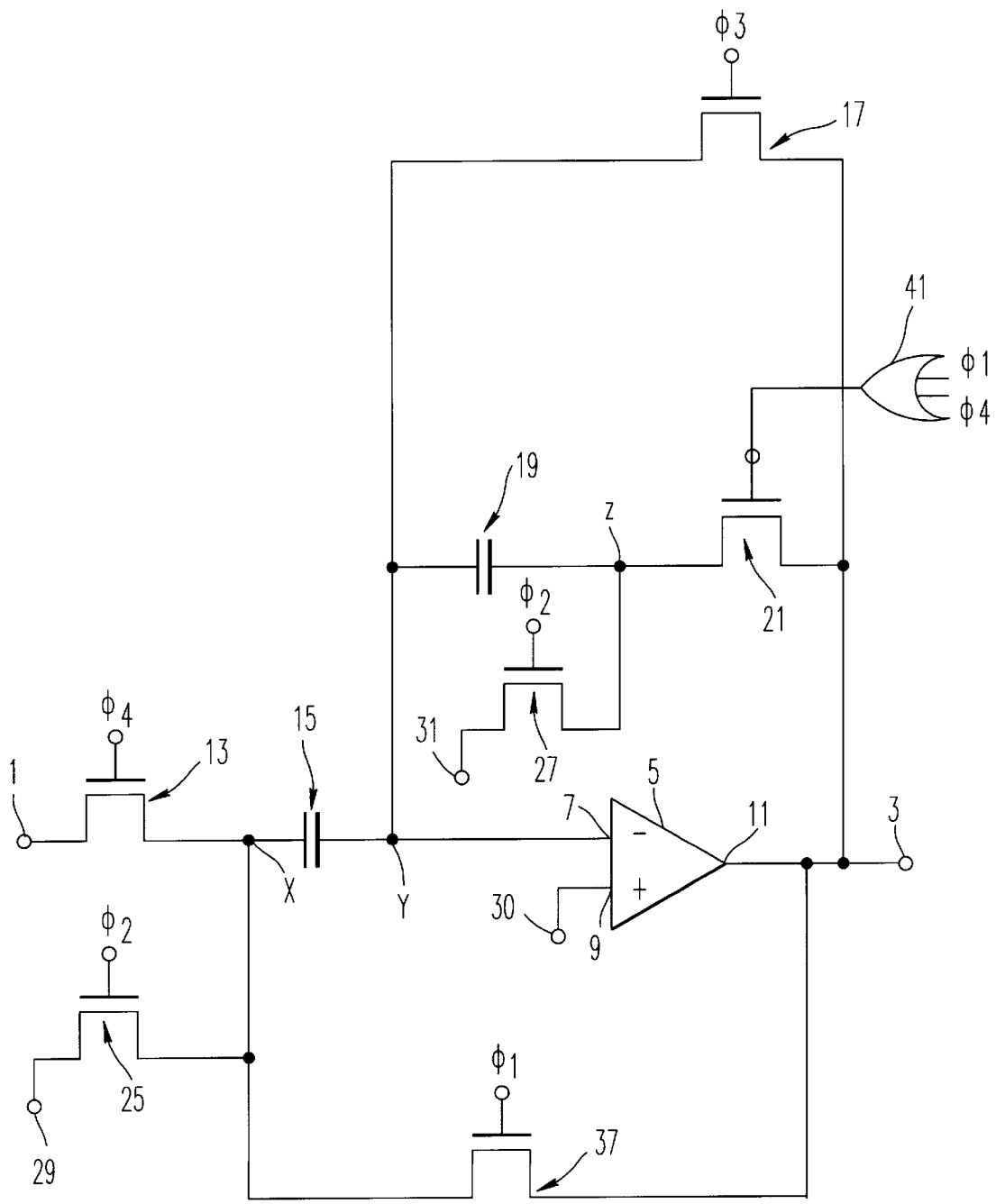
FIG. 8 is a circuit diagram of a gain stage according to the invention.

FIG. 8 is the circuit diagram illustrating the configuration of a gain stage according to a third embodiment of this invention. In this gain stage the MOS switch 35 and the MOS switch 21 shown in FIG. 4 have been replaced by an MOS switch 21 controlled by the output of an OR gate 41 whose inputs are control signals φ1, φ4. Because there are typically many gain stages in a device, eliminating one MOS switch according to this embodiment can reduce the device area since only one OR gate can drive many gain stages.

Figure 9:
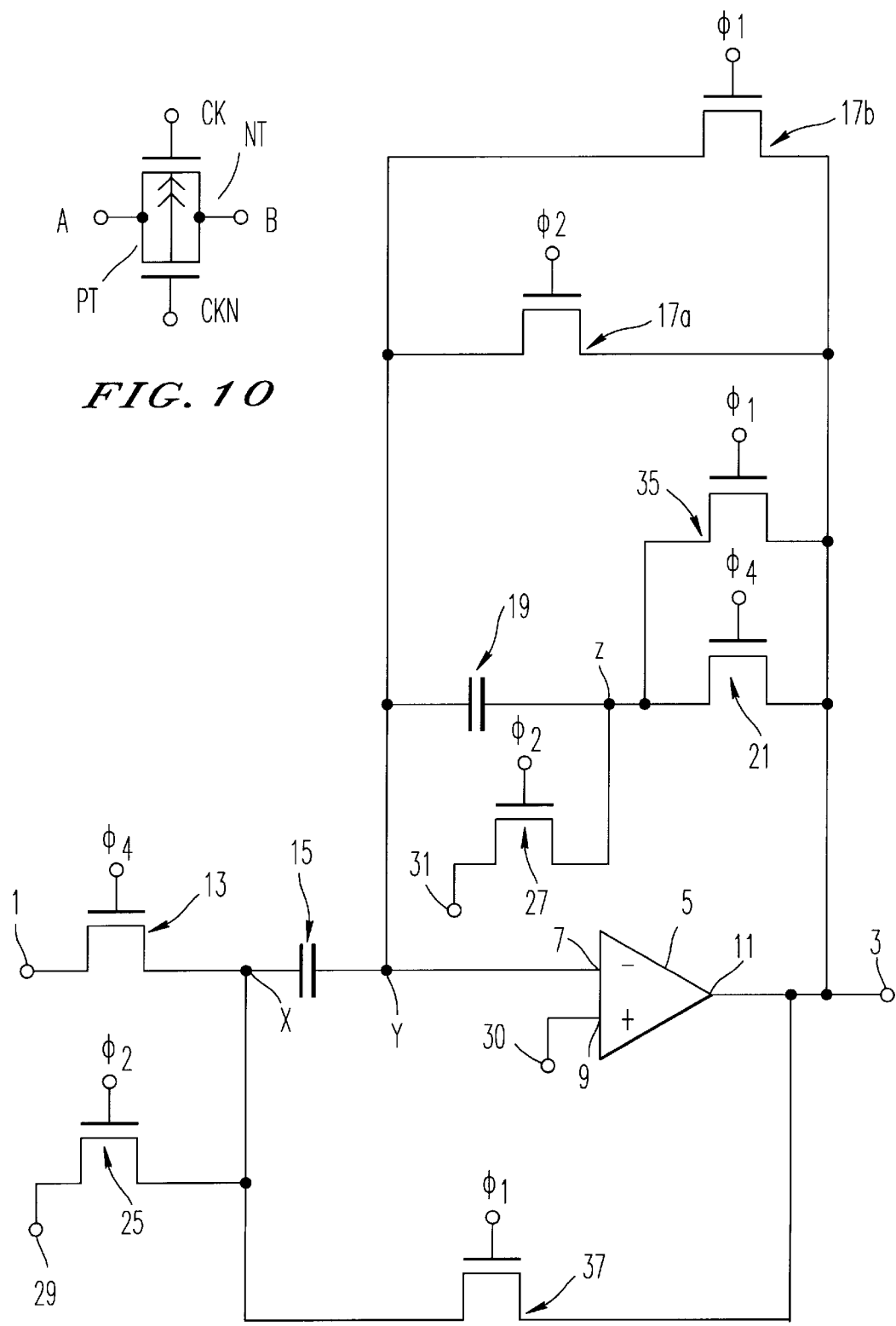
FIG. 9 is a circuit diagram of a gain stage according to the invention.

FIG. 9 is the circuit diagram illustrating the configuration of a gain stage according to a fourth embodiment of this invention. In this gain stage the MOS switch 17 shown in FIG. 4 has been replaced by two MOS switches 17a,17b controlled by φ2, φ1 respectively. So there is no need for the control signal φ3.

Figure 10:
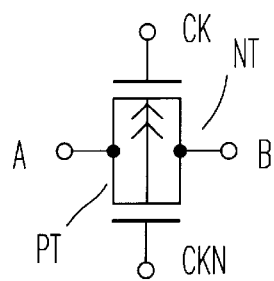
FIG. 10 is a circuit diagram of a CMOS switch.

An MOS switch in the gain stages mentioned in the above embodiments may be replaced by a CMOS switch. The switch is generally comprised of a P-channel MOS transistor PT and an N-channel MOS transistor NT as shown in FIG. 10, the circuit diagram of a CMOS switch. Both of the drain/source of the transistors NT,PT are connected to each other, and a control signal is input through clock terminal CK to the gate of the N-channel MOS transistor NT, and an inverted control signal is input through inverted clock terminal CKN to the gate of the P-channel MOS transistor PT. Using the CMOS switch is effective to eliminate the switching resistance.

Numerous modifications and variations of the present invention are possible in light of the above teachings. It is therefore to be understood that, within the scope of the appended claims, the present invention can be practiced in a manner other than as specifically described herein.

What is claimed is:

1. A gain stage, comprising:

an input terminal;

a first condensor having one end coupled to the input terminal.

2. A gain stage according to claim 1, wherein at least one of the first and second switches comprises a CMOS switch.

3. A gain stage according to claim 1, comprising:

a first reference input source connected to the one end of the first condensor through a third switch; and a second reference input source connected to one end of the second condenser through a fourth switch.

4. A gain stage according to claim 3, comprising:

a fifth switch connected between the one end of the second condensor and the output node of the OP-amp;

wherein another end of said second condenser is connected to the input node of the OP-amp.

5. A gain stage according to claim 4, comprising a sixth switch connected in parallel with said fifth switch; and a seventh switch connected between said input terminal and the one end of the first condensor.

6. A gain stage according to claim 5, comprising:

a first clock connected to the second and sixth switches;

a second clock connected to the third and fourth switches;

a third clock connected to the first switch; and a fourth clock connected to the fifth and seventh switches.

7. A gain stage according to claim 1, comprising:

the first switch being connected between the second switch and the output node of the OP-amp.

8. A gain stage according to claim 7, comprising:

a first reference input source connected to the one end of the first condensor through a third switch;

a second reference input source connected to the one end of the second condensor through a fourth switch, wherein another end of said second condensor is connected to the input node of the OP-amp;

a fifth switch connected between the one end of the second condensor and the output node of the OP-amp;

a sixth switch connected in parallel with said fifth switch; and a seventh switch connected between the input terminal and the one end of the first condensor.

9. A gain stage according to claim 8, comprising:

a first clock connected to the second and sixth switches;

a second clock connected to the third and fourth switches;

a third clock connected to the first switch; and a fourth clock connected to the fifth and seventh switches.

10. A gain stage according to claim 1, comprising:

a third switch connected between one end of the second condensor and the output node of the OP-amp, wherein another end of said second condensor is connected to the input node of the OP-amp; and a logic gate connected to said third switch.

11. A gain stage according to claim 10, comprising:

a first reference input source connected to the one end of the first condensor through a fourth switch; and a second reference input source connected to the one end of the second condensor through a fifth switch;

a sixth switch connected between the input terminal and said one end of the first condensor, a first clock connected to the second switch and the logic gate;

a second clock connected to the fourth and fifth switches;

a third clock connected to the first switch; and a fourth clock connected to the sixth and the logic gate.

12. A gain stage according to claim 1, comprising:

a third switch connected in parallel with the first switch.

13. A gain stage according to claim 12, comprising:

a first reference input source connected to the one end of the first condensor through a fourth switch;

a second reference input source connected to one end of the second condensor through a fifth switch;

a sixth switch connected between the one end of the second condenser and the output node of the OP-amp, wherein another end of said second condensor is connected to the input node of the OP-amp;

a seventh switch connected in parallel with said sixth switch; and an eighth switch connected between the input terminal and the one end of the first condensor.

14. A gain stage according to claim 13, comprising:

a first clock connected to the first, second and seventh switches;

a second clock connected to the third, fourth and fifth switches; and a third clock connected to the sixth and eighth switches.

15. A gain stage, comprising:

an OP-amp;

a plurality of condensors directly connected to the OP-amp; and a plurality of switches connected to the condensors which sets each node connected to any of the condensors to a same voltage in an initialize period.

16. A gain stage according to claim 15,
wherein the switches short-circuit the condensors in the initialize period.

17. A gain stage comprising:
an OP-amp;
a plurality of condensors connected to the OP-amp; and
a plurality of switches connected to the condensors which sets the nodes connected to all of the condensors to a same voltage in an initialize period;
each of said condensers having a node being directly connected to an input terminal of said OP-amp.

* * * * *